(12) United States Patent
Scalia, Jr.

(10) Patent No.: US 10,499,487 B2
(45) Date of Patent: Dec. 3, 2019

(54) LIGHT-EMITTING DIODE (LED) LIGHTING FIXTURE SOLUTIONS AND METHODS

(71) Applicant: Scalia Lighting Technologies LLC, Cumming, GA (US)

(72) Inventor: William H. Scalia, Jr., Cumming, GA (US)

(*) Notice: Subject to any disclaimer, the term of this patent is extended or adjusted under 35 U.S.C. 154(b) by 0 days.

(21) Appl. No.: 15/286,496

(22) Filed: Oct. 5, 2016

(65) Prior Publication Data

US 2017/0097125 A1 Apr. 6, 2017

Related U.S. Application Data

(60) Provisional application No. 62/237,074, filed on Oct. 5, 2015.

(51) Int. Cl.
*F21V 29/70* (2015.01)
*H05K 1/00* (2006.01)
(Continued)

(52) U.S. Cl.
CPC .................. *H05K 1/00* (2013.01); *F21S 8/00* (2013.01); *F21K 9/27* (2016.08); *F21S 2/005* (2013.01);
(Continued)

(58) Field of Classification Search
CPC ...... F21V 9/27; F21V 19/003; F21V 19/0035; F21V 29/508; F21V 29/70; F21V 29/767;
(Continued)

(56) References Cited

U.S. PATENT DOCUMENTS 5,640,792 A 6/1997 Smith et al.
5,828,449 A 10/1998 King et al.
(Continued)

FOREIGN PATENT DOCUMENTS

DE 102013213642 A1 3/2014
EP 2818028 A1 12/2014
WO WO2013124827 8/2013

OTHER PUBLICATIONS

"BackMatrix 49 Professional German LED Board Datenblatt", LUMITRONIX LED-Technik GmbH, Jul. 2016, Rev. 6, pp. 1-10.
(Continued)

*Primary Examiner* — Sean P Gramling
*Assistant Examiner* — Keith G. Delahoussaye

(57) ABSTRACT

An LED light fixture is provided that is usable as a new LED lighting installation or as a retrofit assembly for converting a florescent light fixture into an LED light system. A PCB of the LED light fixture has an M-by-N array of LED modules mounted thereon, where M and N are positive integers that are greater than or equal to 2. The PCB has a heat dissipation system thermally coupled to one of the terminals of each LED module such that heat generated by the LED modules flows directly into the heat dissipation system, which maintains the operating case temperatures of the LED modules at or around ambient temperature, thereby increasing the life expectancies of the LED modules. The M-by-N array of LED modules provides very uniform light distribution without having to overdrive the LED modules, which also increases the life expectancies of the LED modules and conserves power.

20 Claims, 9 Drawing Sheets

(51) Int. Cl.
*F21S 8/00* (2006.01)
*F21S 2/00* (2016.01)
*F21V 19/00* (2006.01)
*F21Y 115/10* (2016.01)
*F21Y 113/00* (2016.01)
*F21Y 105/16* (2016.01)
*F21K 9/27* (2016.01)

(52) U.S. Cl.
CPC .............. *F21V 19/003* (2013.01); *F21V 29/70* (2015.01); *F21Y 2105/16* (2016.08); *F21Y 2113/00* (2013.01); *F21Y 2115/10* (2016.08)

(58) Field of Classification Search
CPC ...... H05K 1/00; H05K 1/0201; H05K 1/0203; H05K 1/0207; H05K 1/021; H05K 1/0212
USPC .............................................. 362/218; 257/88
See application file for complete search history.

(56) References Cited

U.S. PATENT DOCUMENTS

| | | |
|---|---|---|
| 5,887,968 A | 3/1999 | Logan |
| 5,926,557 A | 7/1999 | King et al. |
| 5,943,125 A | 8/1999 | King et al. |
| 5,954,423 A | 9/1999 | Logan et al. |
| 6,118,524 A | 9/2000 | King et al. |
| 6,169,600 B1 | 1/2001 | Ludlow |
| 6,201,892 B1 | 3/2001 | Ludlow et al. |
| 6,236,747 B1 | 5/2001 | Ludlow et al. |
| 6,262,803 B1 | 7/2001 | Ludlow et al. |
| 6,441,312 B1* | 8/2002 | Tanimura ............ H05K 1/0206 174/252 |
| 6,452,339 B1 | 9/2002 | Morrissey et al. |
| 6,452,340 B1 | 9/2002 | Morrissey et al. |
| 6,499,866 B1 | 12/2002 | Logan et al. |
| 6,502,044 B1 | 12/2002 | Lane et al. |
| 6,521,845 B1* | 2/2003 | Barrow ................ H05K 1/0207 174/260 |
| 6,522,147 B1 | 2/2003 | Pickard et al. |
| 6,667,869 B2 | 12/2003 | Greenberg |
| 6,739,734 B1 | 5/2004 | Hulgan |
| 6,769,785 B1 | 8/2004 | Herst et al. |
| 6,841,944 B2 | 1/2005 | Morrissey et al. |
| 7,014,341 B2 | 3/2006 | King et al. |
| 7,053,557 B2 | 5/2006 | Cross et al. |
| 7,182,547 B1 | 2/2007 | Leonhardt et al. |
| D541,467 S | 4/2007 | Gould |
| D541,468 S | 4/2007 | Mayfield, III et al. |
| D544,633 S | 6/2007 | Mayfield, III et al. |
| D544,634 S | 6/2007 | Mayfield, III et al. |
| D544,992 S | 6/2007 | Mayfield, III et al. |
| D544,993 S | 6/2007 | Mayfield, III et al. |
| D545,481 S | 6/2007 | Mayfield, III et al. |
| D545,482 S | 6/2007 | Mayfield, III et al. |
| 7,229,192 B2 | 6/2007 | Mayfield, III et al. |
| D545,991 S | 7/2007 | Mayfield, III et al. |
| D545,992 S | 7/2007 | Mayfield, III et al. |
| D545,993 S | 7/2007 | Mayfield, III et al. |
| 7,261,435 B2 | 8/2007 | Gould et al. |
| 7,325,998 B2 | 2/2008 | Leonhardt et al. |
| 7,333,903 B2 | 2/2008 | Walters et al. |
| D570,027 S | 5/2008 | Miller et al. |
| D571,494 S | 6/2008 | Friedman et al. |
| D583,494 S | 6/2008 | Friedman et al. |
| D583,497 S | 12/2008 | Miller et al. |
| 7,845,103 B2 | 12/2010 | Logan et al. |
| 8,136,965 B2 | 3/2012 | Pickard et al. |
| 8,348,467 B2 | 1/2013 | Khan |
| 8,622,572 B2 | 1/2014 | Morgan |
| 8,789,966 B2 | 7/2014 | Mccanless et al. |
| 8,905,575 B2 | 12/2014 | Durkee et al. |
| 8,956,013 B1 | 2/2015 | Shew |
| 9,127,818 B2 | 9/2015 | Maxik et al. |
| 9,263,718 B2 | 2/2016 | Davidson |
| 2002/0149895 A1 | 10/2002 | Greenberg |
| 2005/0168986 A1 | 8/2005 | Wegner |
| 2007/0057807 A1 | 3/2007 | Walters et al. |
| 2007/0076416 A1 | 4/2007 | Leonhardt et al. |
| 2007/0085701 A1 | 4/2007 | Walters et al. |
| 2007/0285921 A1 | 12/2007 | Zulim et al. |
| 2007/0290328 A1* | 12/2007 | Lin .......................... F21K 9/00 257/701 |
| 2008/0025023 A1* | 1/2008 | Hsieh .................... F21V 29/004 362/249.01 |
| 2012/0002411 A1 | 1/2012 | Ladewig |
| 2012/0051041 A1 | 3/2012 | Edmond et al. |
| 2012/0113628 A1 | 5/2012 | Burrow et al. |
| 2013/0201654 A1 | 8/2013 | Pickard |
| 2014/0117386 A1 | 5/2014 | Rol et al. |
| 2014/0168961 A1 | 6/2014 | Dubord |
| 2014/0226264 A1 | 8/2014 | Davidson |
| 2014/0226316 A1 | 8/2014 | Medendorp, Jr. et al. |
| 2014/0334137 A1 | 11/2014 | Hasenoehrl et al. |
| 2014/0355272 A1 | 12/2014 | Chou |
| 2015/0003070 A1* | 1/2015 | Medendorp, Jr. ......... F21K 9/17 362/294 |

OTHER PUBLICATIONS

"BackMatrix 49 Professional, 24V German LED Board", LUMITRONIX LED-Technik GmbH, p. 1.
"LED Replacements for Four-Foot Linear Fluorescent Lamps, LED Application Series: Linear Fluorescent Replacement Lamps", U.S. Department of Energy, Energy Efficiency & Renewable Energy, EERE Information Center, 1-877-EERE-Info (1-877-337-3463), www.eere.energy.gov/informationcenter, pp. 1-4.
"Specifications for White LED, NF2W757ART-V1, Pb-free Reflow Soldering Application, Built-in ESO Protection Device, RoHS Compliant"; Nichia Corporation, NICHIA STS-DAI-2550D, <Cat. No. 130511>, pp. 1-21.
"A Run for the Money, LED Troffer Kits vs. Best Fluorescent Retrofits"; Stan Walerczyk, LC, CLEP, HCLC, Principal of Lighting Wizards, May 23, 2013.
"Performance of T12 and T8 Fluorescent Lamps and Troffers and LED Linear Replacement Lamps"; Caliper Benchmark Report, by Pacific Northwest National Laboratory, Jan. 2009.

\* cited by examiner

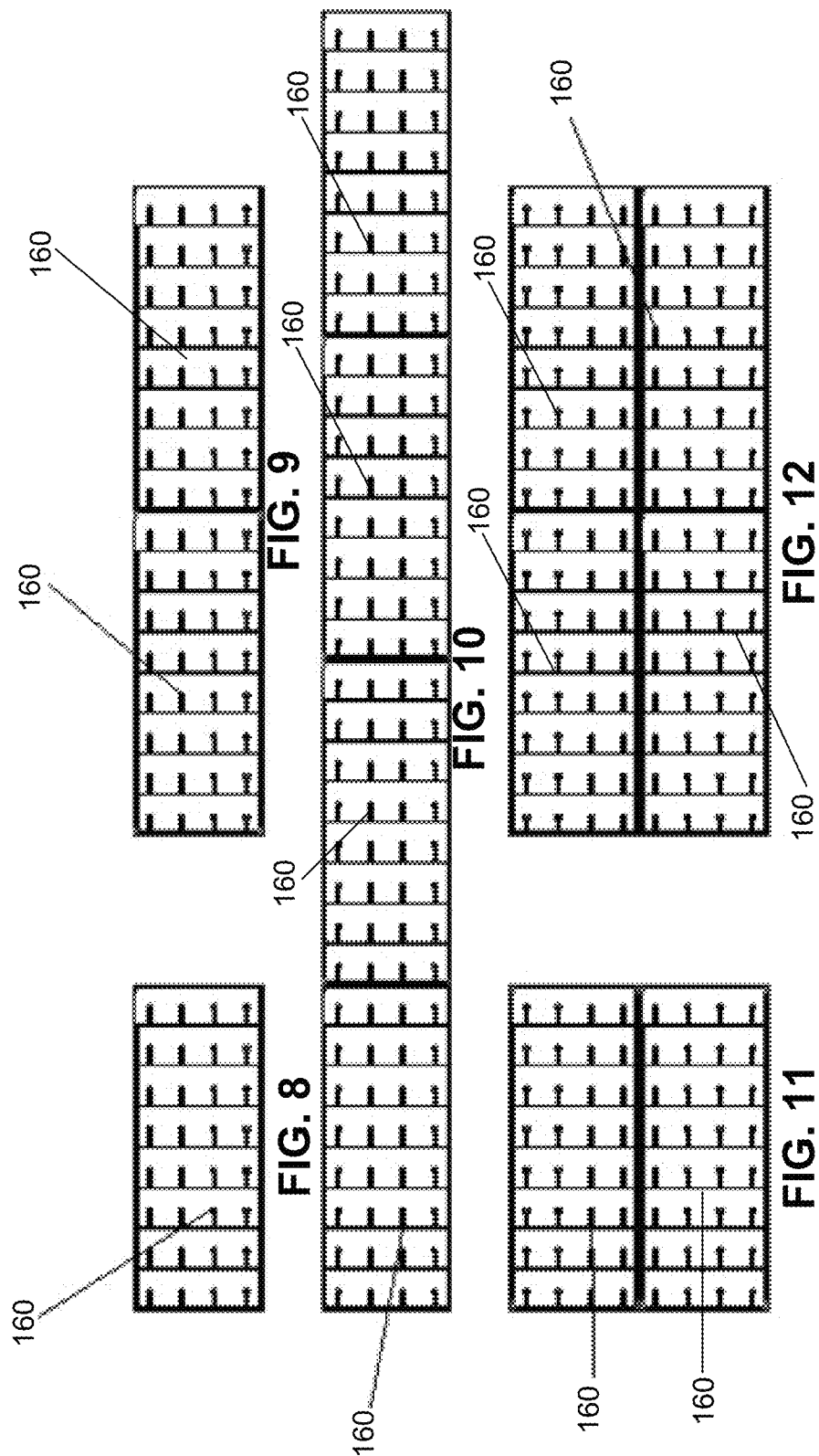

LIGHT-EMITTING DIODE (LED) LIGHTING FIXTURE SOLUTIONS AND METHODS

CROSS-REFERENCE TO RELATED APPLICATIONS

This application is a U.S. nonprovisional application that claims priority to, and the benefit of the earlier filing date of U.S. provisional application Ser. No. 62/237,074, filed on Oct. 5, 2015, entitled "LED LIGHTING FIXTURE SOLUTIONS AND METHODS," which is hereby incorporated by reference herein in its entirety.

TECHNICAL FIELD OF THE INVENTION

The invention relates to light-emitting diode (LED) lighting solutions and methods, and more particularly, to LED lighting solutions and methods and to an LED retrofit kit that may be used to replace existing fluorescent bulb lighting fixtures.

BACKGROUND OF THE INVENTION

Recessed florescent lighting accounts for a large percentage of the luminaires currently installed in commercial lighting around the world. Converting these florescent light fixtures into LED light fixtures can significantly reduce energy consumption. An LED module is essentially a surface mount electrical component that is soldered to a printed circuit board (PCB). As the lighting industry has begun to transition to using LED modules in light fixtures, there has been a tendency to produce LED strips having a linear array of LED modules mounted on them that mimic or emulate the familiar florescent light bulb.

FIG. 1 illustrates a typical florescent light fixture 2 having four florescent bulbs 3, known as T-8 bulbs, each having a one-inch diameter. Electrical power is supplied to the bulbs 3 via metal pins (not shown) that extending from opposite ends of each bulb 3 and are received by respective electrical contacts (not shown) located in tombstones 4 disposed in opposite ends of the fixture 2. Light from each of the bulbs 3 emanates radially outwardly from a center axis of the bulb 3. The florescent light fixture 2 is designed such that light that emanates radially outwardly from the bulbs 3 is reflected off of the inside surface 5 of the fixture 2. The goal of the fixture design is to create a uniform light distribution emanating from a plane that is parallel to the plane in which the inside surface 5 lies. The typical four-lamp T-8 florescent light fixture 2 consumes about 132 watts of power. Conversion to LED can result in substantial energy savings. Therefore, there is a demand for conversion solutions that convert florescent light fixtures into LED light fixtures.

FIG. 2 illustrates a perspective view of a typical LED strip 11 that is used to retrofit the typical four-lamp T-8 florescent light fixture 2 shown in FIG. 1 to convert it into an LED light fixture. The LED strip 11 is made to simulate the bulbs 3 of the florescent light fixture 2 and has metal pins 12 disposed on opposite ends thereof that are configured to engage with the electrical contacts of the tombstones 4.

Other types of LED conversion solutions have LED "bulbs" that also reuse the ballast of the florescent light fixture and strips that fasten to the florescent light fixture in various ways such that the fixture maintains the look of the original florescent bulb. The strip 11 has a linear array of LED modules 13.

One of the disadvantages of the known LED light fixtures of the type described above is that the LED modules of the strips or bulbs comprise sets of LED modules that are arranged in a linear array. For example, a strip may comprise a first set of four LED modules that are electrically connected to one another in series, a second set of four LED modules that are electrically connected to one another in series and linearly aligned with the LED modules of the first set, a third set of four LED modules that are electrically connected to one another in series and linearly aligned with the LED modules of the first and second sets, and a fourth set of four LED modules that are electrically connected to one another in series and linearly aligned with the LED modules of the first, second and third sets to forma linear array of sixteen LED modules. The four sets are connected in parallel. In such arrangements, if one of the LED modules fails, the other LED modules of that set also fail due to the series connection between the LED modules of the set.

Another disadvantage of the known LED light fixtures of the type described above is that they operate at high temperatures. The life expectancy of an LED module is primarily affected by the operating temperature of the LED module. An increase in operating temperature generally results in a reduction in life expectancy. Therefore, thermal management is an important consideration when designing an LED lighting solution. With the known LED strips and bulbs of the type described above, the thermal resistance to heat flow provided by the thermal management solution is so high that the LED modules operate at extremely high temperatures (i.e, several degrees above ambient temperature). Consequently, their life expectancies are relatively short.

Yet another disadvantage of the known LED light fixtures of the type described above is that they do not uniformly distribute light. If the LED strip 11 shown in FIG. 2 were used to retrofit the light fixture 2 shown in FIG. 1, typically two of the LED strips 11 would be used in the fixture 2. Unlike the florescent bulb 3 shown in FIG. 1 that emits light radially outwardly, some of which is reflected from the inside surface 5 of the fixture, the LED modules 13 of the LED strip 11 shown in FIG. 2 emit light in a conical pattern in a direction away from the top surfaces of the LED modules 13, and therefore the light would not be reflected from the inside surface 5 of the fixture 2. Because of the linear arrangement of the LED modules 13 in close proximity to one another, there is substantial overlap of the conical patterns, which results in areas of high-intensity light distribution where the overlap occurs and areas of substantially lower-intensity light distribution where there is no overlap. Also, the distribution of light in between the two LED strips 11 would have a lower intensity than the distribution of light directly beneath the strips 11. The result is a room illuminated with tremendous variations in light intensity levels. Consequently, such an LED light fixture has relatively low light distribution efficiency. In addition, the LED modules 13 are often overdriven with high electrical currents to increase illumination to compensate for the lack of uniformity in light distribution. Overdriving the LED modules 13 can further reduce their life expectancies.

A need exists for a cost-effective, efficient and reliable LED lighting solution that is a suitable retrofit solution for florescent light fixtures and that overcomes the aforementioned disadvantages. A need also exists for a cost-effective, reliable and efficient LED light fixture that is suitable is a new installation and that overcomes the aforementioned disadvantages.

BRIEF DESCRIPTION OF THE DRAWINGS

Elements features or components in the drawings are not intended to be drawn to scale unless specifically stated herein. Like elements, features or components are indicated by the use of like reference numerals in the drawings.

FIG. 8 illustrates a schematic representation of a universal PCB that can be used to create various LED light fixtures or to retrofit existing florescent light fixtures to convert them into LED light fixtures.

FIG. 9 schematically illustrates two of the universal PCBs shown in FIG. 8 placed end to end and electrically interconnected.

FIG. 10 schematically illustrates four of the universal USBs shown in FIG. 8 placed end to end and electrically interconnected to provide uniform light distribution in a retrofitted florescent light fixture with the florescent light bulbs removed.

FIG. 11 schematically illustrates two of the universal PCBs shown in FIG. 8 placed side by side and electrically interconnected to provide uniform light distribution in a retrofitted 2-by-2 lay-in florescent light fixture with the florescent light bulbs removed.

FIG. 12 schematically illustrates two sets of universal PCBs placed side by side to provide uniform light distribution in a retrofitted three or four lamp 2-by-4 lay-in florescent light fixture with the florescent bulbs removed.

WRITTEN DESCRIPTION

Figure 1:
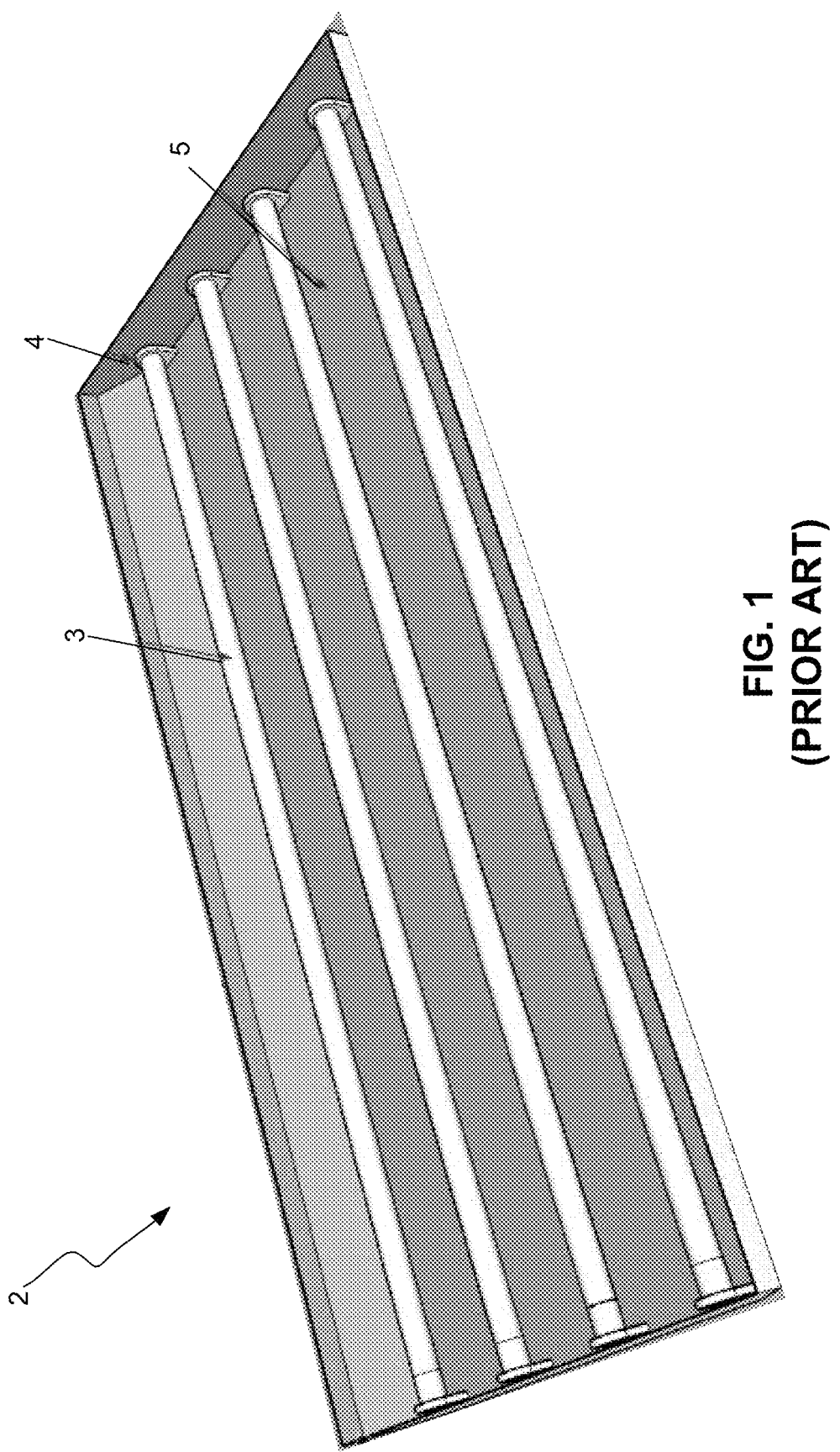
FIG. 1 illustrates a typical florescent light fixture having four florescent bulbs, known as T-8 bulbs, each having a one-inch diameter.
Figure 2:
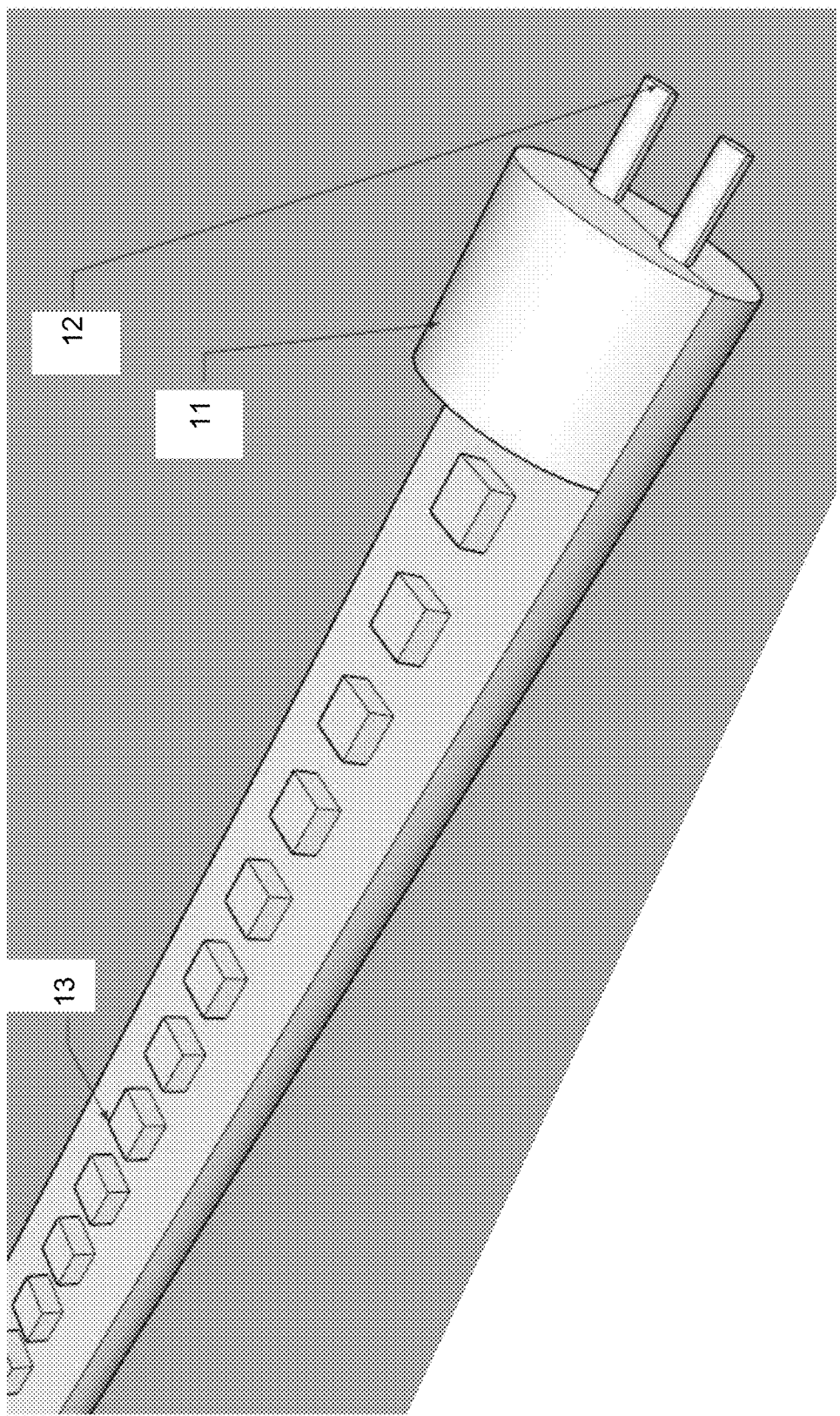
FIG. 2 illustrates a perspective view of a typical LED strip that is used to retrofit the typical four-lamp T-8 florescent light fixture shown in FIG. 1 to convert it into an LED light fixture.

In accordance with illustrative, or exemplary, embodiments, an LED light fixture is provided that is usable as a new LED lighting installation or as a retrofit assembly for converting a florescent light system into an LED light system. The LED light fixture includes a PCB having an M-by-N array of LED modules mounted thereon, where M and N are positive integers that are greater than or equal to 2. The PCB has a heat dissipation system that is thermally coupled to one of the electrodes of each LED module such that heat generated by the junctions of the LED modules flows into the heat dissipation system and is dissipated. The heat dissipation system is extremely effective and is capable of maintaining the operating case temperatures of the LED modules at or around ambient temperature, which increases the life expectancies of the LED modules. The M-by-N array of LED modules provides very uniform light distribution without requiring that the LED modules be overdriven, which also increases the life expectancies of the LED modules and conserves power.

In accordance with a representative embodiment, the PCB consists of a top layer of electrically-conductive material of high thermal conductivity, such as copper, for example, and a bottom layer of a dielectric material, such as an epoxy laminate material, for example. Electrically-conductive traces are formed in the top layer of electrically-conductive material and are electrically coupled to first and second electrodes of the LED modules. The electrically-conductive traces that are electrically coupled to the first electrodes of the LED modules comprise a large area of the top layer of electrically-conductive material, which interfaces with air. Heat generated by the LED modules flows out of the first electrodes into the large area of the top layer of electrically-conductive material and spreads out through the large area. Thus, the majority of the heat generated by the LED modules is dissipated through the top layer. The spreading out of the heat in the large area of the top layer and the contact of the top layer with the surrounding air quickly dissipate heat, allowing the LED modules to be maintained at operating case temperatures that are at or close to ambient temperature. The low complexity of the PCB allows it to be manufactured cost effectively, while at the same time providing a highly effective heat dissipation system.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to with acceptable limits or degree. For example, "substantially cancelled" means that one skilled in the art would consider the cancellation to be acceptable.

As used in the specification and the appended claims and in addition to its ordinary meaning, the term "approximately" or "about" mean to within an acceptable limit or amount to one having ordinary skill in the art. For example, "approximately the same" means that one of ordinary skill in the art would consider the items being compared to be the same.

Various types of circuit boards are used in known LED light fixtures. The FR-4 board and the Metal Core board are two of the most popular circuit boards used for this purpose.

Figure 3:
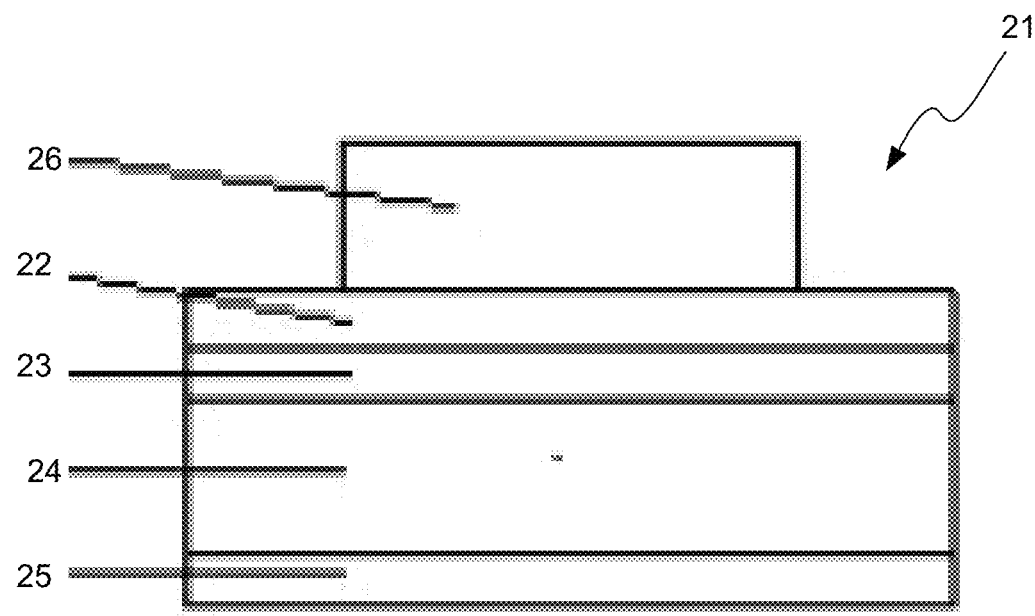
FIG. 3 illustrates a cross-sectional view of an FR-4 circuit board.

FIG. 3 illustrates a cross-sectional view of an FR-4 circuit board 21. The FR-4 circuit board 21 has five layers, namely, a solder layer 22, an uppermost copper layer 23 beneath the solder layer 22, an epoxy laminate layer 24 beneath the uppermost copper layer 23, and a bottom copper layer 25 beneath the epoxy laminate layer 24. The LED modules 26 are mounted on the solder layer 22. With this configuration, the thermal pathway is typically as follows: heat generated by the LED modules 26 is transferred through the solder layer 22, through the upper most copper layer 23, through the epoxy laminate layer 24, and into the bottom copper layer 25 before being transferred to the fixture, air, or a separate heat sink device. The thermal resistance encountered by the heat along this thermal pathway is very high. For this reason, the LED modules 26 operate at temperatures that are much higher than ambient temperature, which results in the LED modules 26 having reduced life expectancies.

Figure 4:
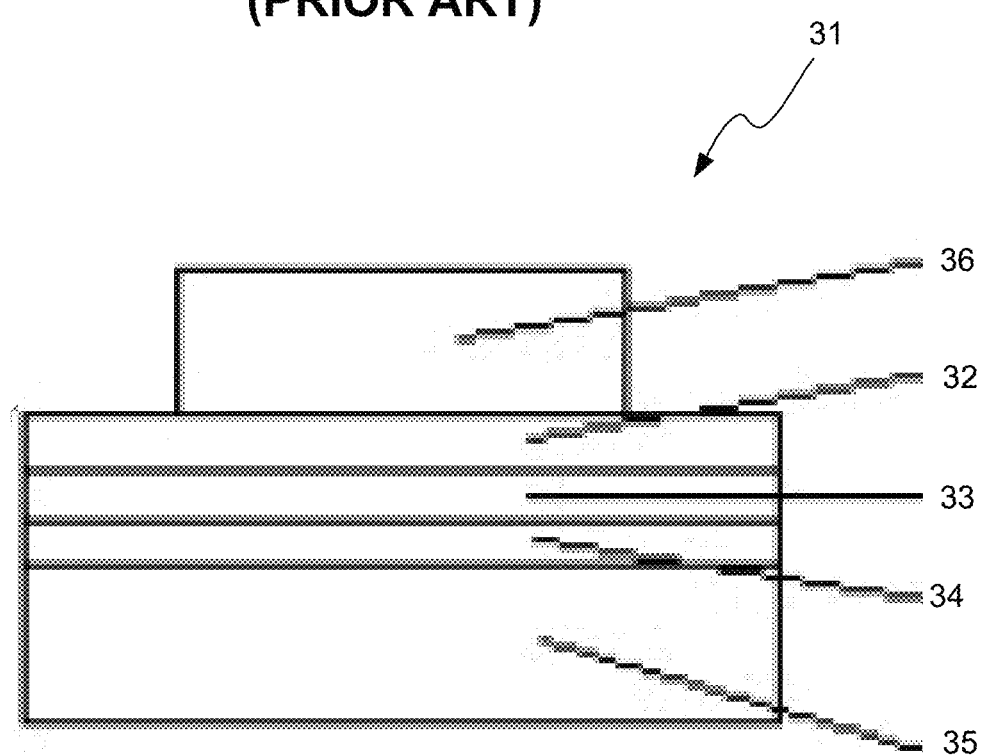
FIG. 4 illustrates a cross-sectional view of a Metal Core circuit board.

FIG. 4 illustrates a cross-sectional view of a Metal Core circuit board 31. The Metal Core circuit board 31 has four layers, namely, a solder layer 32, a copper layer 33 beneath the solder layer 32, a dielectric bonding layer 34 beneath the copper layer 33 and an aluminum layer 35 beneath the dielectric bonding layer 34. The LED modules 36 are mounted on top of the solder layer 32. With this configuration, the thermal pathway is typically as follows: heat generated by the LED modules 36 is transferred from the LED modules 36 through the solder layer 32, through the copper layer 33, through the dielectric bonding layer 34 and into the aluminum layer 35 before being transferred either to air or other surfaces, such as the fixture or a separate heat sink device. As with the FR-4 circuit board 21, the thermal resistance encountered by the heat along the thermal pathway is very high for the Metal Core circuit board 31. For this reason, the LED modules 36 operate at temperatures that are much higher than ambient temperature, which results in the LED modules 36 having reduced life expectancies.

Using 270 square millimeters (mm$^2$) as the area of the LED modules 26 and 36 as an example, the thermal resistance of the boards 21 and 31 is typically about 30 degrees Celsius (C) per watt and 0.2 degrees C. per watt, respectively. The Metal Core circuit board 31 is a much better conductor of heat than the FR-4 circuit board 21, but the FR-4 circuit board 21 is much less expensive than the Metal Core circuit board 31. Various known techniques have been used to increase the thermal conductivity of the FR-4 circuit board 21, such as, for example, drilling holes in the epoxy laminate layer 24 and filling them with solder or copper to increase the thermal conduction between the uppermost copper layer 23 and the bottom copper layer 25. These techniques have generally been successful at reducing the thermal resistance of the FR-4 circuit board from about 30 degrees C. per watt to about 12 degrees C. per watt, but they also increase costs. Furthermore, the reduction in thermal resistance achieved by such techniques is in sufficient to maintain the operating case temperature of the LED modules at or around ambient temperature.

Figure 5:
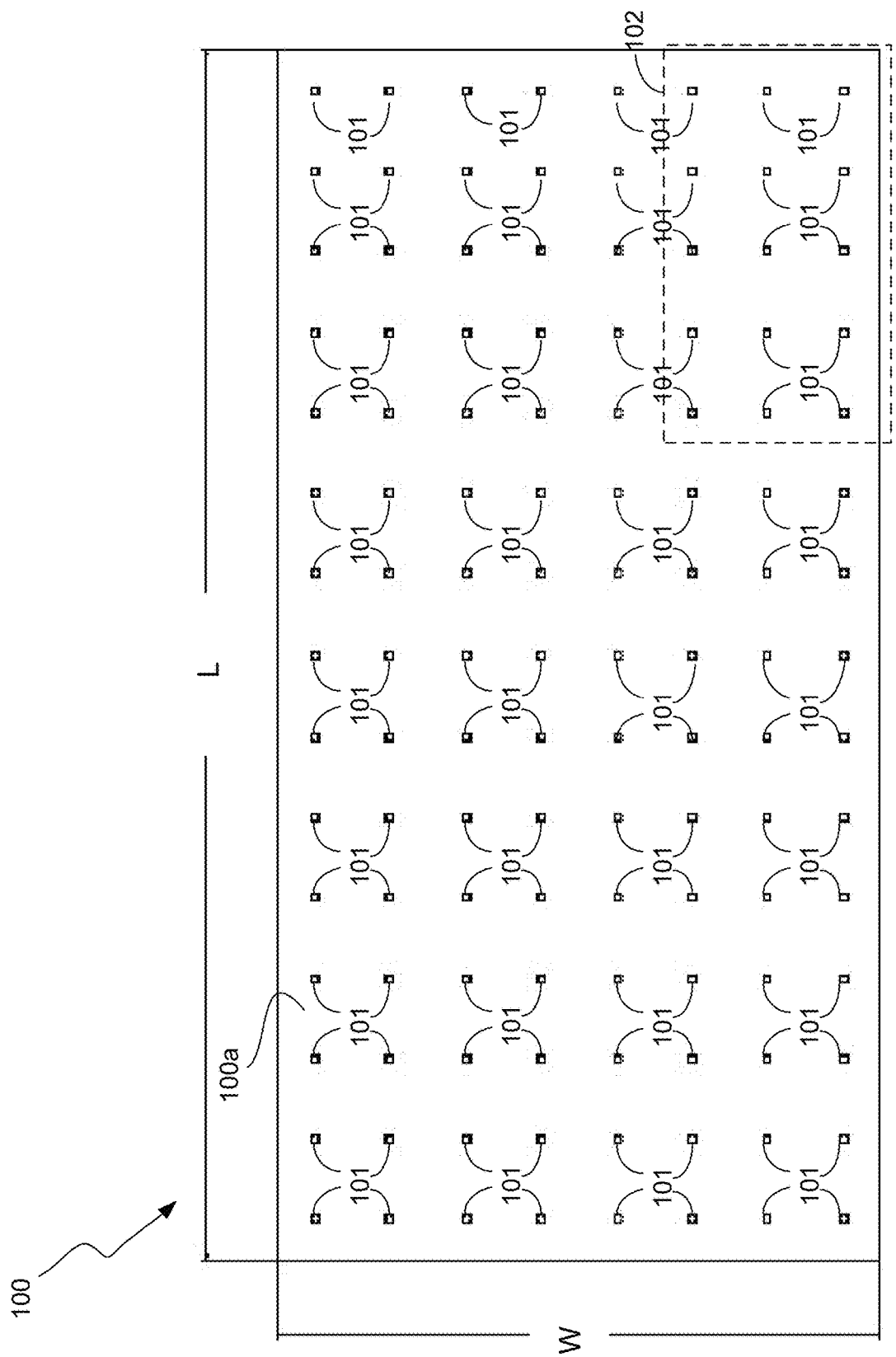
FIG. 5 illustrates a plan view of the PCB in accordance with a representative embodiment of having an M-by-N array of LED modules mounted thereon.
Figure 6:
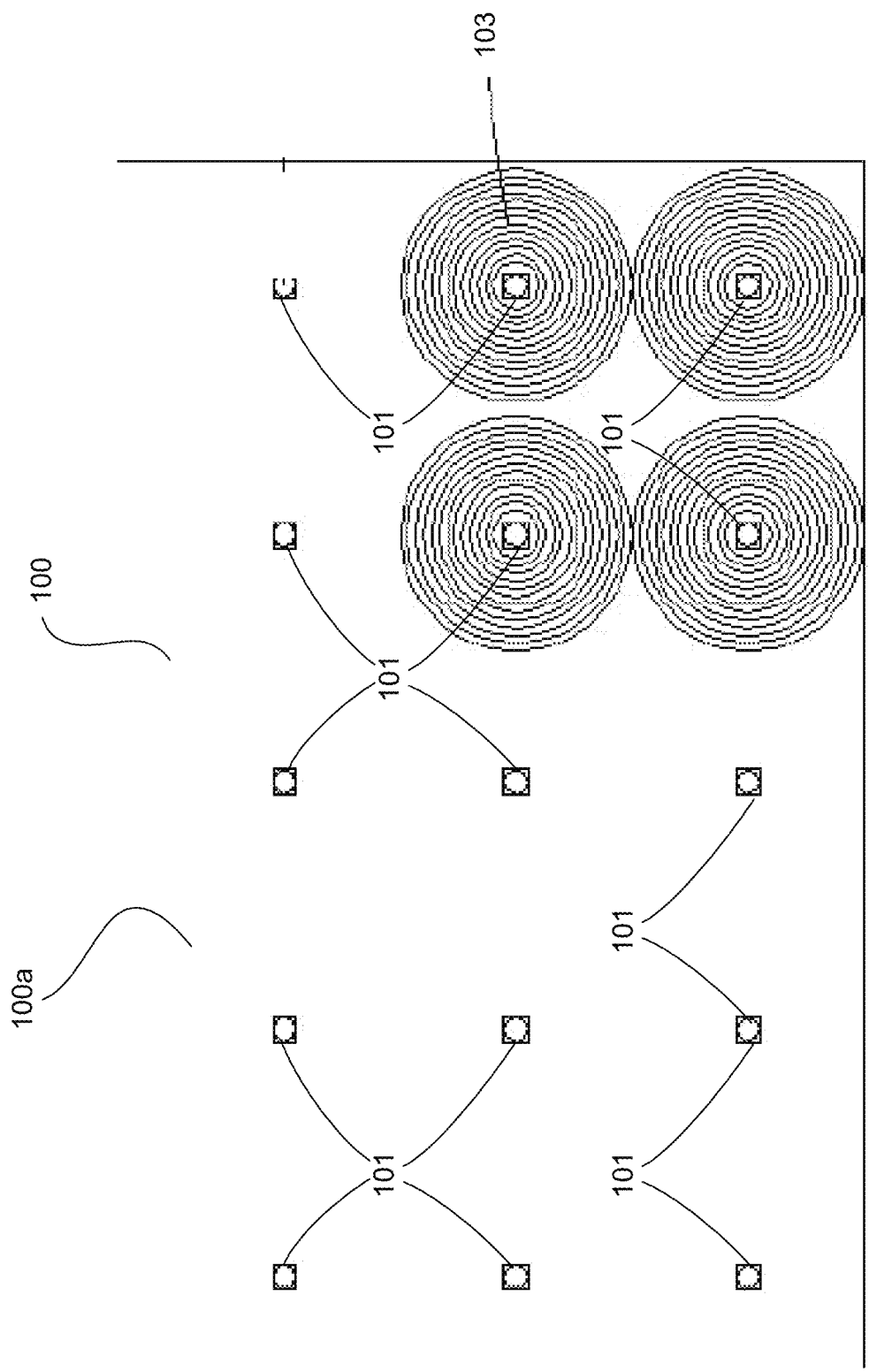
FIG. 6 illustrates an enlarged view of the portion of the PCB shown in FIG. 5 in the dashed box labeled with reference numeral 102.

FIG. 5 illustrates a plan view of the PCB 100 in accordance with a representative embodiment of having an M-by-N array of LED modules 101 mounted thereon. FIG. 6 illustrates an enlarged view of the portion of the PCB 100 shown in FIG. 5 in the dashed box labeled with reference numeral 102. In accordance with this representative embodiment, the PCB 100 has a top layer 100a of electrically-conductive material of high thermal conductivity (e.g., copper) and a bottom layer of a dielectric material, such as an epoxy laminate material, for example. The bottom layer of dielectric material is not visible in FIGS. 5 and 6.

The LED modules 101 are mounted on the top layer 100a using typical surface mount technology (SMT). As will be described below in more detail, electrically-conductive traces are formed in the top layer 100a of electrically-conductive material and are electrically coupled to first and second electrodes (not shown) of the LED modules 101. One of the first and second electrodes is the positive connection to the LED module 101 and the other of the first and second electrodes is the negative connection to the LED module 101.

The electrically-conductive traces that are electrically coupled to the first electrodes of the LED modules 101 comprise a large area of the top layer 101a of electrically-conductive material, which interfaces with air. Heat generated by the LED modules 101 flows out of the first electrodes into the large area of the top layer 101a of electrically-conductive material and spreads out through the large area. The spreading out of the heat in the large area of the top layer 100a and the contact of the top layer 100a with the surrounding air quickly dissipates heat, allowing the LED modules 101 to be maintained at operating case temperatures that are at or close to ambient temperature.

With reference to FIG. 6, the LED modules 101 are typically soldered to mounting positions of the top layer 100a such that the first electrodes (not shown) are electrically and thermally coupled to the top layer 100a. Thus, the top layer 100a provides both the electrical connection and the heat sink for the LED modules 101. The rings 103 shown in FIG. 6 represent the manner in which heat generated by the LED modules 101 radiates outwardly from the LED modules 101 through the top layer 101a. The top layer 100a interfaces with air. Therefore, as the heat spreads out into the top layer 100a, the top layer 100a is also being cooled by the air. The combination of the heat spreading out into the top layer 100a and the top layer 100a being cooled by the surrounding air causes the LED modules 101 to be maintained at an operating case temperature at or near ambient air temperature, i.e., not more than 10 degrees Fahrenheit (10° F.) above ambient temperature. With known LED lighting solutions of the type described above, the operating case temperatures are typically about 70° F. above ambient temperature. The low operating case temperatures of the LED module 101 increase their life expectancies and also keep the environment where the LED light fixture is used cooler. In addition, the low complexity of the PCB 100, i.e., having only the two layers of materials, allows it to be manufactured cost effectively.

Figure 7:
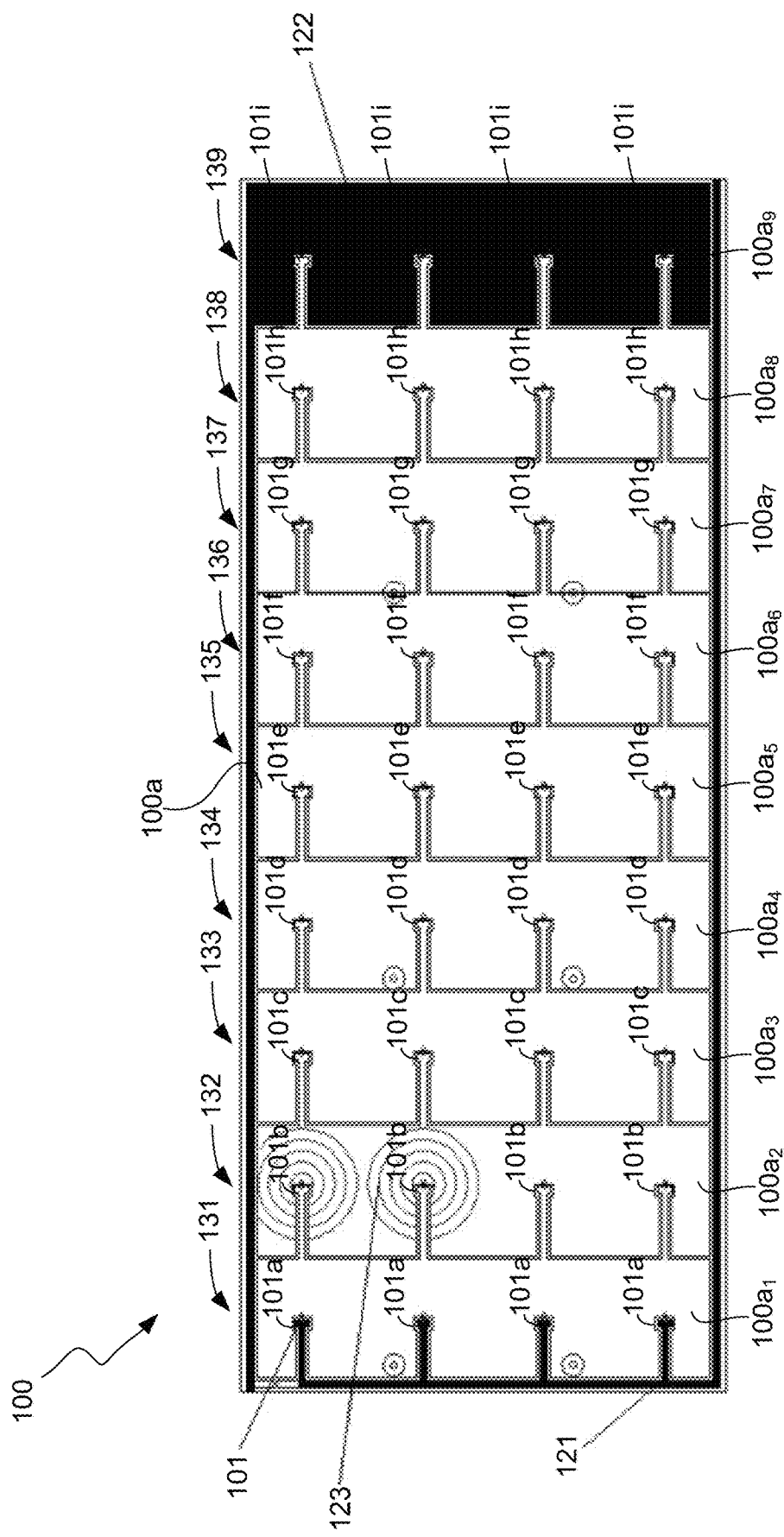
FIG. 7 illustrates a schematic representation of the PCB shown in FIGS. 5 and 6 in accordance with a representative embodiment.

FIG. 7 illustrates a schematic representation of the PCB 100 shown in FIGS. 5 and 6 in accordance with a representative embodiment. In accordance with this representative embodiment, the LED modules 101 are equally spaced throughout the PCB 100. In accordance with this representative embodiment, the LED modules 101 are Luxeon 3020 LED modules, which are sold by a company called Philips Lumileds of San Jose, Calif. These particular LED modules dissipate about 90% of the heat generated at the respective junctions of the LED modules through the respective solder mounts coupled to the negative electrodes of the LED modules. In accordance with this representative embodiment, the solder mounts that are connected with the negative electrodes of the LED modules 101 are disposed on large areas $100a_1$-$100a_9$ of the top layer 100a. The majority of the heat generated by the junctions of the LED modules 101 flows through the solder mount connected to the negative electrodes of the LED modules 101 into the large areas 100$a_1$-100$a_9$ of the top layer 100a and is dissipated through the top layer 100a.

In the schematic diagram shown in FIG. 7, the LED modules 101 are placed horizontally relative to the drawing page such that the positive solder mounts of the LED modules 101 are positioned to the left and the negative solder mounts of the LED modules 101 are positioned to the right. In accordance with this representative embodiment, each column 131-139 of LED modules 101 are connected electrically in parallel with one another and then the columns 131-139 are connected in series with one another. This configuration has advantages over the known LED strips or bulbs in which the LED modules of each group are connected in series with one another and then the groups are connected in parallel with one another in that the failure of an LED module 101 in one of the columns 131-139 will not result in a failure of the other LED modules 101 within the same column. However, the principles and concepts of the inventive teachings are not limited to the configuration shown in FIG. 7.

A positive trace 121 connects to the positive electrodes of the LED modules 101a of a first set arranged in a first column 131. A negative copper trace 122 connects to each of the large areas 100$a_1$-100$a_9$ of the top layer 100a disposed in the columns 131-139, respectively. The large area 100$a_1$ of the top layer 100a is connected to the negative electrodes of the LED modules 101a located in column 131 and to the positive electrodes of LED modules 101b located in column 132. The large area 100$a_2$ of the top layer 100a is connected to the negative electrodes of the LED modules 101b located in column 132 and to the positive electrodes of LED modules 101c located in column 133. The large area 100$a_3$ of the top layer 100a is connected to the negative electrodes of the LED modules 101c located in column 133 and to the positive electrodes of LED modules 101d located in column 134. The large area 100$a_4$ of the top layer 100a is connected to the negative electrodes of the LED modules 101d located in column 134 and to the positive electrodes of LED modules 101e located in column 135. The large area 100$a_5$ of the top layer 100a is connected to the negative electrodes of the LED modules 101e located in column 135 and to the positive electrodes of LED modules 101f located in column 136. The large area 100$a_6$ of the top layer 100a is connected to the negative electrodes of the LED modules 101f located in column 136 and to the positive electrodes of LED modules 101g located in column 137. The large area 100$a_7$ of the top layer 100a is connected to the negative electrodes of the LED modules 101g located in column 137 and to the positive electrodes of LED modules 101h located in column 138. The large area 100$a_8$ of the top layer 100a is connected to the negative electrodes of the LED modules 101h located in column 138 and to the positive electrodes of LED modules 101i located in column 139.

Thus, it can be seen from the above description of FIG. 7 that the negative electrodes of all of the LED modules 101a-101i are connected to the large areas 100$a_1$-100$a_9$, respectively, of the top layer 100a of the PCB 100. This feature ensures that the heat generated by the respective junctions of the LED modules 101a-101i will flow outwardly from the LED modules 101a-101i in the manner demonstrated by heat rings 123. Consequently, most of the heat generated by the LED modules 101a-101i will spread out into the top layer 101a and will be dissipated through heat spreading and through contact of the top layer 101a with the surrounding air. In accordance with the preferred embodiment, the LED modules 101a-101i are mounted on the top layer 100a such that there is more than one square inch of surface area of the top layer 100a per LED module 101a-101i. If each LED module 101a-101i generates one-third of a watt of heat, this corresponds to 3 square inches of surface area of the top layer 100a that is available for each LED module 101a-101i for spreading and dissipating heat.

It should be noted that while the representative embodiment described above with reference to FIG. 7 uses LED modules that use the negative solder mount to move heat from the junctions to the top layer 100a, other LED modules may use the positive solder mount or an additional solder mount for this purpose. Therefore, the inventive principles and concepts are not limited to the solder mount or the terminal of the LED modules that are used for this purpose.

FIG. 8 illustrates a schematic representation of a universal PCB 160 that can be used to create various LED light fixtures or to retrofit existing florescent light fixtures to convert them into LED light fixtures. One typical florescent light fixture comprises two four-foot florescent bulbs positioned side by side. In accordance with a representative embodiment, the universal PCB 160 has the same or a similar configuration to the PCB 100 shown in FIG. 7 and is about 8.5 inches wide and about 22 inches long such that two of the PCBs 160 placed end to end in the florescent light fixture with the florescent bulbs removed provide uniform light distribution. FIG. 9 schematically illustrates two of the universal PCBs 160 placed end to end and electrically interconnected. It should be noted that the positioning of the positive and negative traces 121 and 122, respectively, shown in FIG. 7 facilitate making the end to end electrical connections.

A second typical florescent light fixture comprises two eight-foot florescent light bulbs positioned side by side. FIG. 10 schematically illustrates four universal PCBs 160 placed end to end and electrically interconnected to provide uniform light distribution in a retrofitted florescent light fixture with the florescent light bulbs removed. Again, the positioning of the positive and negative traces 121 and 122, respectively, shown in FIG. 7 facilitate making the end to end electrical connections.

A third typical florescent light fixture comprises two U-shaped bulbs in what is commonly referred to as a 2-by-2 lay-in florescent light fixture. FIG. 11 schematically illustrates two universal PCBs 160 placed side by side and electrically interconnected to provide uniform light distribution in a retrofitted 2-by-2 lay-in florescent light fixture with the florescent light bulbs removed. In this case, the positioning of the positive and negative traces 121 and 122, respectively, across the bottom and top of the PCB as shown in FIG. 7 facilitate making the side by side electrical interconnections between the PCBs 160.

A forth typical florescent light fixture comprises three or four four-foot bulbs in what is commonly referred to as a 2-by-4 lay-in florescent light fixture. FIG. 12 schematically illustrates two sets of universal PCBs placed side by side to provide uniform light distribution in a retrofitted three or four lamp 2-by-4 lay-in florescent light fixture with the florescent bulbs removed.

Therefore, the universal PCB 160 provides greater manufacturing versatility because the PCBs 160 can be made in the universal size for stocking and can be adapted to the various retrofit configurations or new assembly configurations to adjust to sales volumes.

Figure 13:
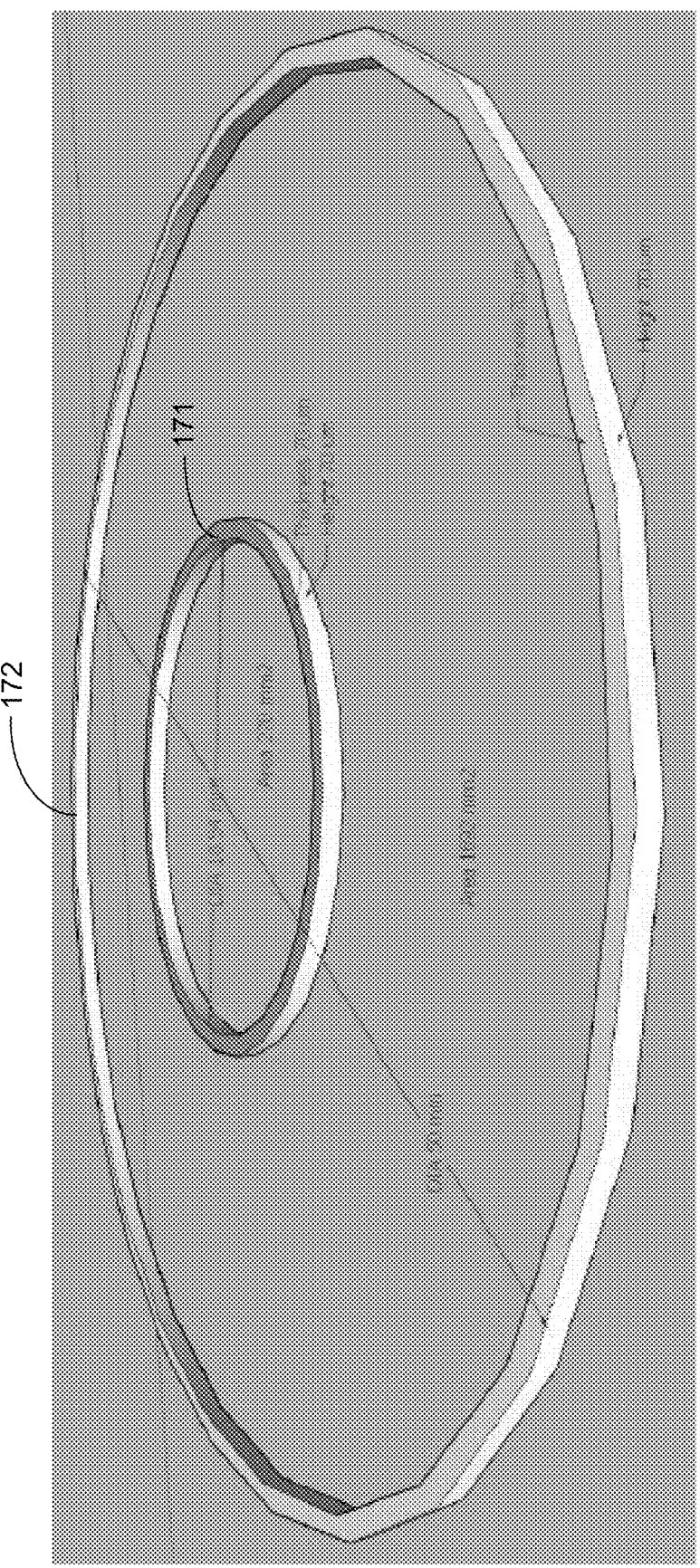
FIG. 13 schematically illustrates two rings of the top layer of the PCB shown in FIGS. 5 and 6.

In accordance with one representative embodiment, the LED retrofit light fixture in accordance with the present teachings is used to covert a 2-foot-by-4 foot florescent light fixture that consumes 132 watts of power into an LED light fixture that consumes 30 watts of power. If, for example, ¼-watt LED modules are chosen for the conversion, a total of 120 LED modules will consume 30 watts of power. If ¼-watt LED modules are chosen, then the LED module pattern shown in FIG. 5, for example, would result in eight rows of fifteen LED modules 101s, thus providing a uniform distribution of both light and heat. Assuming that the PCB 100 consists of the two-layer structure described above, FIG. 13 schematically illustrates two rings 171 and 172 of the top layer 100a. The first ring 171 has a diameter of 18.54 mm and corresponds to a surface area of 270 mm² of the top layer 100a. The second ring 172 has a diameter of about 50 mm and corresponds to a surface area of about 1692 mm².

The total thermal resistance of the first ring 171 is about 0.00004282° C./watt, which is orders of magnitude lower than the thermal resistance of the FR-4 and Metal Core PCBs 21 and 31, respectively, shown in FIGS. 3 and 4, respectively. Additionally, as the heat flows outwardly from the LED modules 101 in the rings patterns 103 (FIG. 6), the surface area in thermal communication with both the air and the LED modules 101 increases as a square of the radius of the rings. The amount of surface area of the top layer 100a that is in direct thermal communication with the LED module 101 and with the air increases dramatically from the first ring 171 to the second ring 172. This causes the thermal resistance to heat flow to decrease dramatically with the increase in distance from the LED module 101. Therefore, there is a reduction of thermal resistance as the heat flows away from the LED module 101, which is generally the opposite of what happens with the known LED strips and bulbs.

Thus, in accordance with a representative embodiment in which the PCB 100 consists of a single layer of dielectric material (e.g., epoxy laminate) and a single layer of electrically conductive and thermally conductive material (e.g., copper), the number of components that are needed for the LED light fixture and the thermal resistance of the thermal pathways are simultaneously decreased, resulting substantially reduced LED module operating temperatures and an LED light fixture that can be made at reduced costs.

Figure 14:
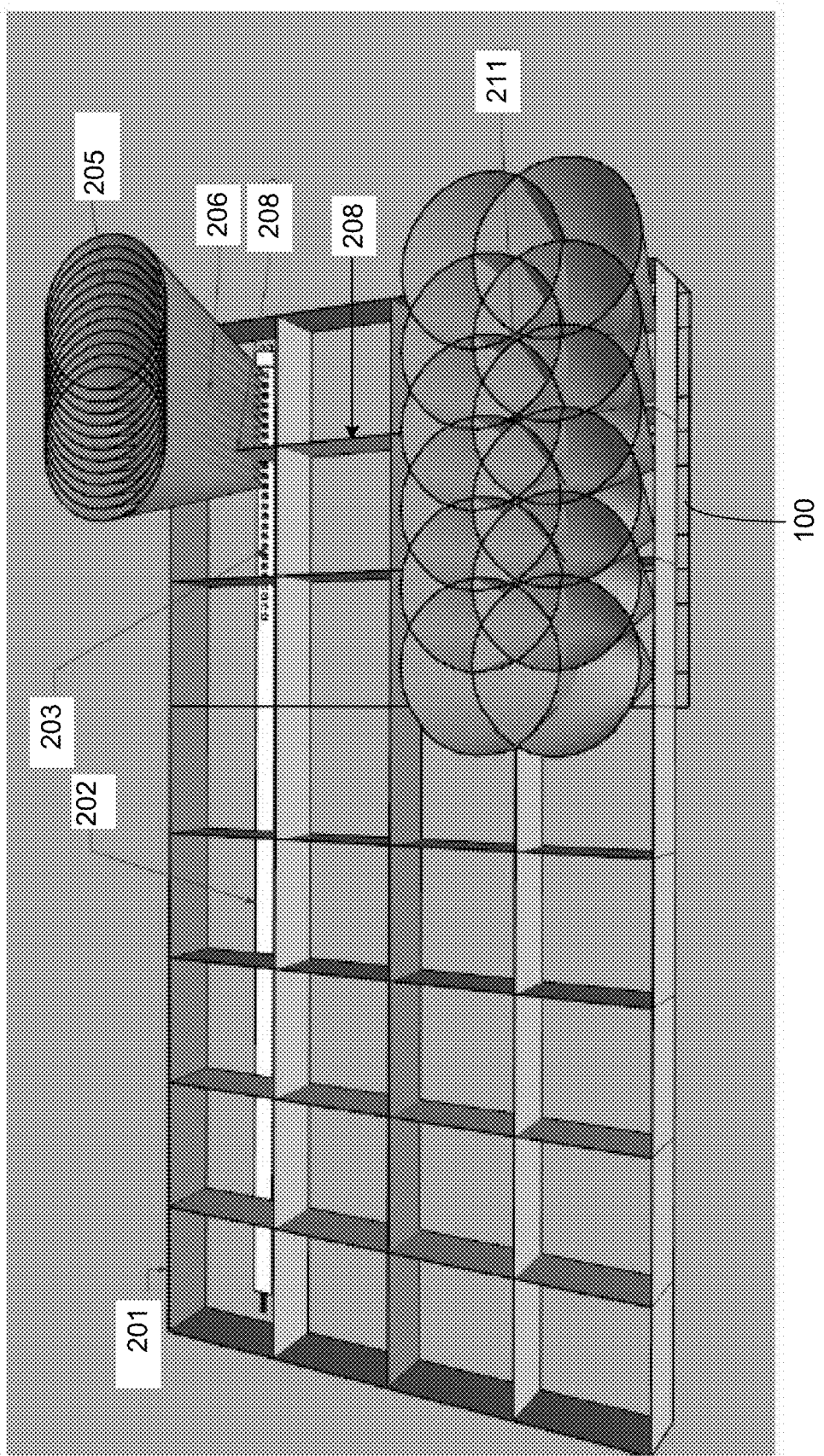
FIG. 14 illustrates a perspective view of a typical thirty-two-cell parabolic light fixture having both the known LED strip and the PCB shown in FIGS. 5 and 6 to demonstrate differences in the ways in which light emanates from them.

FIG. 14 illustrates a perspective view of a typical thirty-two-cell parabolic light fixture 201 having both the known LED strip 202 described above and the PCB 100 to demonstrate differences in the ways in which light emanates from them. Another benefit of the present teachings can be seen when designing a retrofitting light fixture for the typical thirty-two-cell parabolic light fixture 201. The light fixture 201 has thirty-two cells that are made of three inch tall aluminum reflectors. This light fixture 201 is a popular light fixture in commercial applications. This fixture 201 would normally have four florescent bulbs in either a T-12 or T-8. One florescent bulb would be centered in each of the four rows of squares to provide a uniform light output. Typical LED retrofit kits would incorporate two of the LED strips 202. Some LED retrofit kits position the LED strips 202 in the outside rows leaving the two inside rows darker. Some LED retrofit kits position the LED strips 202 in the center two rows and leave the outside rows darker. Some LED retrofit kits position the LED strips 202 under the reflectors between the outside and inside rows and try to cast light into all of the rows. All of these retrofit kits create light and dark areas in the light fixture.

In the known arrangement, the LED module 203 of the strip 202 are positioned on the top side of a strip 202 or on top of a simulated bulb. The typical light pattern 205 provided by the known arrangement is made up of tightly packed overlapping cones of light 206. Some of the light from this pattern will be blocked by the squares 208, or grids, in the parabolic fixture 201. The light overlap results in high intensity linear light patterns with darker areas in the balance of the fixture 201. To compensate for this difference in levels of intensity, the LED modules 203 of the strip 202 are sometimes overdriven, which, as indicated above, can result in the LED modules 203 having shorter life expectancies and higher power consumption.

In contrast, the light pattern 211 resulting from the arrangement shown in FIGS. 5-7 combined with the light fixture 201 is very uniform and equally distributed such that the light uniformly floods each square 208. Thus, both light patterns 205 and 211 are a result of light being emitted from twelve LED modules, but the light pattern 211 fully floods the squares 208 while the light pattern 205 results in a linear light pattern of high intensity being emitted from the center of the square 208. In addition, this uniformity in light distribution is achieved without having to overdrive the Led modules 101.

It should be noted that representative embodiments have been described herein for the purpose of demonstrating the inventive principles and concepts. As will be understood by persons of skill in the art, in view of the description provided herein, many variations can be made to the illustrative embodiments described herein without deviating from the scope of the invention. For example, while the PCBs 100 and 160 have been described as having particular configurations and as having particular arrays of LED modules mounted on them, other PCB configurations and LED module array configurations may be used. Persons skilled in the art will understand, in view of the description provided herein, the manner in which these and other modifications may be made and that all such modifications are within the scope of the invention.

What is claimed is:

1. A light emitting diode (LED) light fixture comprising:
a circuit board having at least a bottom layer of a dielectric material and a top layer of electrically conductive and thermally conductive material;
an M-by-N array of LED modules mounted on a top surface of the top layer, where M and N are positive integers that are greater than or equal to 2, the top layer having first and second electrically-conductive traces formed therein, each LED module having first and second electrodes, the first and second electrodes being connected by first and second solder mounts, respectively, to either the first electrically-conductive trace or the second electrically-conductive trace for providing electrical power to the LED modules, and wherein the first electrically-conductive trace also acts as a heat dissipation system that dissipates a majority of heat generated by the LED modules; and
a fixture having a bottom surface and a plurality of side walls, the circuit board being secured to the fixture such that the bottom layer of the circuit board is disposed in between the bottom surface of the fixture and the top surface of the circuit board.

2. The LED light fixture of claim 1, wherein the first electrically-conductive trace provides each LED module with at least one square inch of surface area of the top surface of the top layer for spreading and dissipating heat generated by the respective LED module.

3. The LED light fixture of claim 1, wherein the heat dissipation system maintains the LED modules at respective operating case temperatures that are not more than 10 degrees Fahrenheit (F) above ambient temperature.

4. The LED light fixture of claim 3, wherein the heat dissipation system maintains the LED modules at respective operating case temperatures that are not more than 5 degrees Fahrenheit (F) above ambient temperature.

5. The LED light fixture of claim 1, wherein the circuit board consists of the top layer and the bottom layer.

6. The LED light fixture of claim 5, wherein the top layer is a layer of metal and the bottom layer is a layer of an epoxy laminate material.

7. The LED light fixture of claim 1, wherein the M-by-N array of LED modules is made up of M rows of LED modules and N columns of LED modules, the LED modules of each column being electrically connected in parallel with the other LED modules of the respective column, the LED modules of each row being electrically connected in series with the other LED modules of the respective row.

8. A light emitting diode (LED) light fixture comprising:
a circuit board consisting of a bottom layer of a dielectric material and a top layer of electrically conductive and thermally conductive material;
an M-by-N array of LED modules mounted on a top surface of the top layer, where M and N are positive integers that are greater than or equal to 2, the top layer having first and second electrically-conductive traces formed therein, each LED module having first and second electrodes, the first and second electrodes being connected by first and second solder mounts, respectively, to either the first electrically-conductive trace or the second electrically-conductive trace for providing electrical power to the LED modules; and
a fixture having a bottom surface and a plurality of side walls, the circuit board being secured to the fixture such that the bottom layer of the circuit board is disposed in between the bottom surface of the fixture and the top surface of the circuit board.

9. The LED light fixture of claim 8, wherein the first electrically-conductive trace also acts as a heat dissipation system that dissipates a majority of heat generated by the LED modules.

10. The LED light fixture of claim 9, wherein the first electrically-conductive trace provides each LED module with at least one square inch of surface area of the top surface of the top layer for spreading and dissipating heat generated by the respective LED module.

11. The LED light fixture of claim 9, wherein the heat dissipation system maintains the LED modules at respective operating case temperatures that are not more than 10 degrees Fahrenheit (F) above ambient temperature.

12. The LED light fixture of claim 8, wherein the top layer is a layer of metal and the bottom layer is a layer of an epoxy laminate material.

13. A light emitting diode (LED) light fixture comprising:
a circuit board having at least a bottom layer of a dielectric material and a top layer of electrically conductive and thermally conductive material;
an M-by-N array of LED modules mounted on a top surface of the top layer, where M and N are positive integers that are greater than or equal to 2, the top layer having first and second electrically-conductive traces formed therein, each LED module having first and second electrodes, the first and second electrodes being connected by first and second solder mounts, respectively, to either the first electrically-conductive trace or the second electrically-conductive trace for providing electrical power to the LED modules, wherein the M-by-N array of LED modules is made up of M rows of LED modules and N columns of LED modules, the LED modules of each column being electrically connected in parallel with the other LED modules of the respective column, the LED modules of each row being electrically connected in series with the other LED modules of the respective row; and
a fixture having a bottom surface and a plurality of side walls, the circuit board being secured to the fixture such that the bottom layer of the circuit board is disposed in between the bottom surface of the fixture and the top surface of the circuit board.

14. The LED light fixture of claim 13, wherein the first electrically-conductive trace also acts as a heat dissipation system that dissipates a majority of heat generated by the LED modules.

15. The LED light fixture of claim 14, wherein the first electrically-conductive trace provides each LED module with at least one square inch of surface area of the top surface of the top layer for spreading and dissipating heat generated by the respective LED module.

16. The LED light fixture of claim 13, wherein the heat dissipation system maintains the LED modules at respective operating case temperatures that are not more than 10 degrees Fahrenheit (F) above ambient temperature.

17. A light emitting diode (LED) light fixture comprising:
L circuit boards, where L is a positive integer that is greater than or equal to one, each circuit board having at least a bottom layer of a dielectric material and a top layer of electrically conductive and thermally conductive material, and wherein L is selected based on a size that the LED lighting fixture is intended to be;
an M-by-N array of LED modules mounted on a top surface of the top layer of each circuit board, where M and N are positive integers that are greater than or equal to 2, the top layer of each circuit board having first and second electrically-conductive traces formed therein, each LED module having first and second electrodes, the first and second electrodes being connected by first and second solder mounts, respectively, of the respective circuit board to either the first electrically-conductive trace or the second electrically-conductive trace of the respective circuit board for providing electrical power to the LED modules of the respective circuit board; and
a fixture having a bottom surface and a plurality of side walls, each circuit board being secured to the fixture such that the bottom layer of each circuit board is disposed in between the bottom surface of the fixture and the top surface of the respective circuit board.

18. The LED light fixture of claim 17, wherein L is equal to at least two such that there are at least first and second circuit boards, and wherein the first and second circuit boards are positioned end to end such that a Nth column of the M-by-N array of the first circuit board is adjacent the first column of the M-by-N array of the second circuit board.

19. The LED light fixture of claim 17, wherein L is equal to at least two such that there are at least first and second circuit boards, and wherein the first and second circuit boards are positioned side by side such that a Nth column of the M-by-N array of the first circuit board is aligned with an Nth column of the M-by-N array of the second circuit board.

20. The LED light fixture of claim 17, wherein L is equal to at least four such that there are at least four circuit boards, and wherein the first and second circuit boards are positioned end to end such that a Nth column of the M-by-N array of the first circuit board is adjacent the first column of the M-by-N array of the second circuit board, and wherein the third and fourth circuit boards are positioned end to end such that a Nth column of the M-by-N array of the third circuit board is adjacent the first column of the M-by-N array of the fourth circuit board, and wherein the first and third circuit boards are positioned side by side such that a Nth column of the M-by-N array of the first circuit board is aligned with an Nth column of the M-by-N array of the third circuit board, and wherein the second and fourth circuit boards are positioned side by side such that a Nth column of the M-by-N array of the second circuit board is aligned with an Nth column of the M-by-N array of the fourth circuit board.

* * * * *